United States Patent [19]
Jung

[11] Patent Number: 5,734,429
[45] Date of Patent: Mar. 31, 1998

[54] START CODE DETECTING APPARATUS FOR BIT STREAM OF COMPRESSED IMAGE

[75] Inventor: Jun-mo Jung, Suwon, Rep. of Korea

[73] Assignee: Samsung Electronics Co., Ltd., Kyungki-do, Rep. of Korea

[21] Appl. No.: 580,648

[22] Filed: Dec. 29, 1995

[30] Foreign Application Priority Data

Dec. 30, 1994 [KR] Rep. of Korea ............. 94-40133

[51] Int. Cl.⁶ .................................. H04N 7/035
[52] U.S. Cl. ..................... 348/390; 348/384; 348/423; 348/461; 348/465; 370/509; 370/521; 375/369; 377/64
[58] Field of Search ............... 348/390, 384, 348/423, 461, 465; 370/509, 521; 375/369; 377/64

[56] References Cited

U.S. PATENT DOCUMENTS 5,231,486  7/1993  Acampora et al. .......... 348/390
5,280,349  1/1994  Wang et al. ................. 348/390
5,361,097  11/1994 Kolczynski .................. 348/390
5,400,075  3/1995  Savatier ...................... 348/384
5,452,006  9/1995  Auld ........................... 348/845.3
5,532,744  7/1996  Akiwumi-Assani et al. .... 348/390

*Primary Examiner*—Tommy P. Chin
*Assistant Examiner*—Frank Snow
*Attorney, Agent, or Firm*—Sughrue, Mion, Zinn, Macpeak & Seas, PLLC

[57] ABSTRACT

A start code detecting apparatus for detecting a start code which indicates the start position of each layer from the bit stream of a compressed image according to the MPEG-standard is provided. The start code detecting apparatus includes two registers, a barrel shifter, a start code detector, a state machine, a code length generator and an accumulator. The start code detecting apparatus adopts the barrel shifter and the start code detector, so that the start code designating the start position of each layer can be effectively detected from the compressed bit stream.

1 Claim, 1 Drawing Sheet

START CODE DETECTING APPARATUS FOR BIT STREAM OF COMPRESSED IMAGE

BACKGROUND OF THE INVENTION

The present invention relates to a start code detecting apparatus for detecting a start code which indicates the start position of each layer from the bit stream of a compressed image according to the standard suggested by the Moving Picture Experts Group (MPEG).

A video sequence according to the MPEG-2 standard is comprised of a sequence header, one or more picture groups following the sequence header, and a sequence end code. A compressed bit stream should have a syntax. Here, the syntax is comprised of six layers for supporting each signal process or system function.

Table 1 shows each syntax layer and the functions corresponding to each syntax layer.

TABLE 1

| syntax layer | function |
| --- | --- |
| sequence layer | random access unit |
| picture group layer | random access unit |
| picture layer | basic coding unit |
| slice layer | resynchronizing unit |
| macro block layer | motion compensating unit |
| block layer | DCT unit |

An MPEG-2 decoder should recognize the start position of each layer so as to correctly decode the compressed bit stream. In the MPEG-2 stream, each layer is classified by a specific code which is called a start code. The start code is a reserved code which should not occur at any other place of the bit stream.

Table 2 shows the start codes of each layer.

TABLE 2

| syntax layer | value |
| --- | --- |
| sequence layer | 000001B3h |
| picture group layer | 000001B8h |
| picture layer | 00000100h |
| slice layer | 00000101h |
| macro block layer | 00000111h |

SUMMARY OF THE INVENTION

It is an object of the present invention to provide a start code detecting apparatus for detecting a start code which indicates the start position of each syntax layer from a bit stream of a compressed image.

To achieve the above object, there is provided a start code detecting apparatus for detecting a start code which indicates the start position of each layer from the bit stream of a compressed image according to MPEG-2 standard, comprising: two registers connected in series for converting an input bit stream into parallel data of a predetermined latched bit number (N), for shifting the stored bit rows in response to a carry signal and for outputting the shifted bit rows; a barrel shifter for receiving the parallel data latched by the two registers and outputting a successive bit row of a predetermined bit number (M), wherein the bit row follows from a position designated by a shift signal applied to the barrel shifter; a start code detector for storing the start code of each layer in the compressed bit stream as an input entry, detecting whether the output bit rows of the barrel shifter match the input entry, and outputting the matched start code; a state machine for storing the start code of each layer and a state code corresponding to the start code as an input entry, and outputting the state code corresponding to the start code output from the start code detector; a code length generator for storing the state code of each layer and the bit number corresponding to each state code as an input entry, and outputting the bit number corresponding to the state code output from the state machine; and an accumulator for accumulating the outputs of the code length generator and applying the accumulated value as a shift signal of the barrel shifter and a carry as a carry signal of the registers, respectively.

BRIEF DESCRIPTION OF THE DRAWINGS

The above objects and advantages of the present invention will become more apparent by a detailed description of a preferred embodiment thereof with reference to the attached drawings in which.

DETAILED DESCRIPTION OF THE INVENTION

Figure 1:
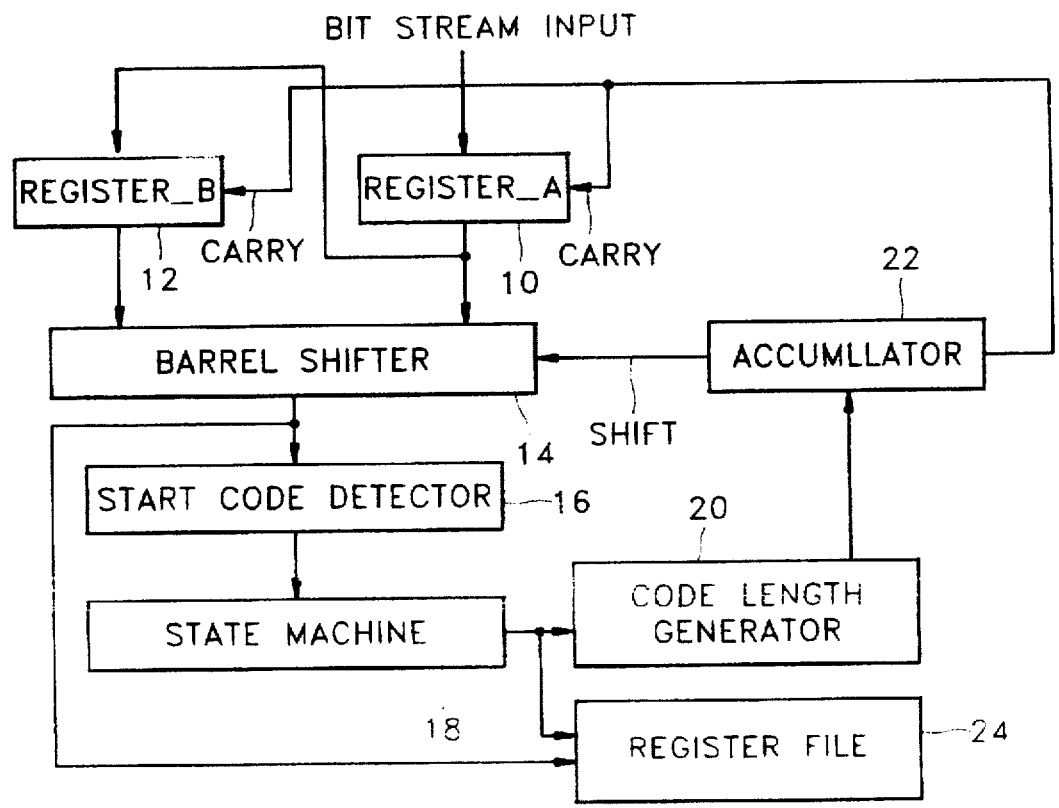
FIG. 1 is a block diagram showing the structure of a start code detecting apparatus according to the present invention.

FIG. 1 shows a start code detecting apparatus according to the present invention. Reference numerals 10 and 12 denote a register$_{13}$ A and a register$_{13}$ B, respectively, reference numeral 14 denotes a barrel shifter, reference numeral 16 denotes a start code detector, reference numeral 18 denotes state machine, a reference numeral 20 denotes a code length generator, reference numeral 22 denotes an accumulator, and reference numeral 24 denotes a register file.

Register$_{13}$ A 10 and register$_{13}$ B 12 are connected in series. Register$_{13}$ A 10 latches the compressed bit stream every N bits and register$_{13}$ B 12 latches the bit stream output from register$_{13}$ A 10. Register$_{13}$ A 10 and register$_{13}$ B 12 shift the bit rows latched in response to a carry signal applied thereto and then output the shifted bit rows. As the shifted bit rows latched by each register are output, the first N bits of the compressed bit stream is input to register$_{13}$ A 10 in sequence, and the shifted bit rows output from register$_{13}$ A 10 are sequentially input to register$_{13}$ B 12 and then latched. The bit rows latched by register$_{13}$ A 10 and register$_{13}$ B 12 are applied to barrel shifter 14, as N-bit parallel data.

Barrel shifter 14 receives N-bit parallel data output from register$_{13}$ A 10 and register$_{13}$ B 12 and each input thereof is sequentially aligned to form 2N-bit parallel data. Barrel shifter 14 outputs M-bit parallel data among the 2N-bit parallel data in response to a shift signal applied thereto, wherein the M-bit parallel data follows in sequence from a position designated by the shift signal.

Figure 2:
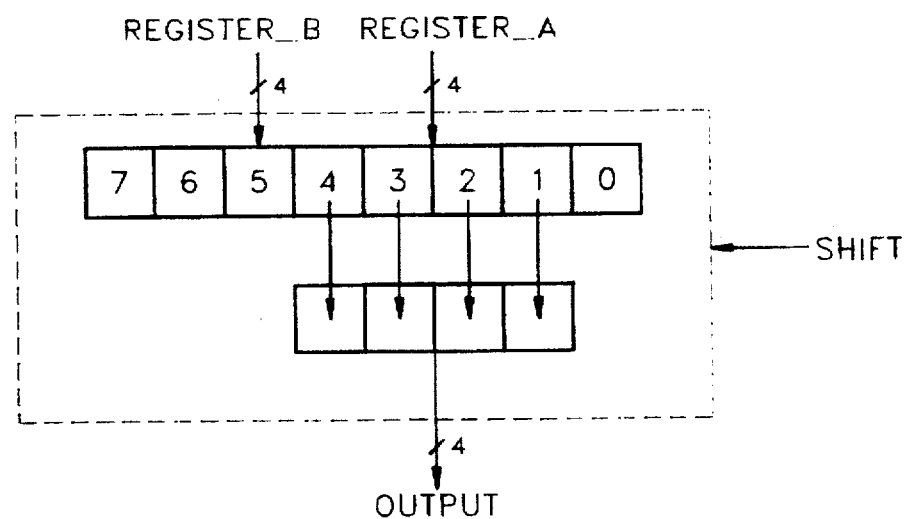
FIG. 2 is a diagram of illustrating the operation of the barrel shifter shown in FIG. 1.

FIG. 2 is a diagram illustrating the operation of barrel shifter 14 shown in FIG. 1. As is well known, when barrel shifter 14 outputs the data, the bit position of the data is shifted according to the value of the shift signal applied thereto. For example, as shown in FIG. 2, assuming that 8-bit data is input, 4-bit data is output and the value of the shift signal is three, the fourth to seventh bit rows, numbered 4, 3, 2, 1, are output among 8-bit parallel data.

Start code detector 16 detects whether the bit rows output from barrel shifter 14 include the start codes of each layer of the MPEG-2 compressed bit stream and outputs the corresponding start code. Start code detector 16 stores the various start codes as an input entry. It is then determined whether the stored input entries match the parallel data output from barrel shifter 14, and if a start code matching the parallel data is detected, the detected start code is provided to state machine 18.

Here, the start code is a reference for sectioning the bit stream. More specifically the bit number of the respective parameters following the start code is varied according to the content of the start code. For example, a start code is followed by parameters such as a 4-bit parameter, a 2-bit parameter and a 3-bit parameter, while another start code is followed by parameters such as a 3-bit parameter, a 5-bit parameter and a 1-bit parameter. Thus, if a start code is detected, the number of parameters following the start code and the bit number of each parameter can be obtained.

State machine 18 outputs the state codes corresponding to the bit number of each successive parameter following the start code provided from start code detector 16.

As described above, the number of parameters following the start code and the bit number of each parameter varies according to the start code. The value of state codes output from state machine 18 represents the bit number of each parameter. For example, if there are three successive parameters following a start code comprised of four bits, two bits and three bits, respectively, the number of the state codes corresponding to the start code is three (state #1, state #2 and state #3), the values of each state code being 4, 2 and 3, respectively.

Register file 24 takes the data corresponding to the bit number designated by the state code provided from state machine 18, among the parallel data output from barrel shifter 14, and stores the taken parallel data in register file 24. For example, when the state codes are state #1, state #2 and state #3, a 4-bit register, 2-bit register and 3-bit register are required.

Code length generator 20 decodes the bit number corresponding to the state code output from state machine 18 and provides the result to accumulator 22. Accumulator 22 sums the previously accumulated value and the bit number output from code length generator 20 and provides the result to the shift terminal of barrel shifter 14. Barrel shifter 14 outputs the parallel data shifted by the shift signal applied thereto.

The carry generated from accumulator 22 is provided as the carry signal of register$_{13}$ A 10 and register$_{13}$ B 12. When the carry signal is applied, register$_{13}$ A 10 and register$_{13}$ B 12 shift the stored bit rows, by outputting the shifted bit rows and latching new input bit rows.

As described above, the start code detecting apparatus according to the present invention adopts a barrel shifter and a start code detector, so that the start code representing the start position of each syntax layer can be effectively detected from the bit stream of the compressed image according to the MPEG standard.

What is claimed is:

1. A start code detecting apparatus for detecting a start code which indicates a start position of each layer in a bit stream of a compressed image according to MPEG-2 standard, comprising:

two registers connected in series for converting an input bit stream into parallel data of a predetermined latched bit number, for shifting stored bit rows in response to a carry signal and for outputting shifted bit rows;

a barrel shifter for receiving the parallel data latched by said two registers and outputting a successive bit row of a predetermined bit number, wherein the bit row follows from a position designated by a shift signal applied to said barrel shifter;

a start code detector for storing the start code of each layer in the bit stream as an input entry, for detecting whether the bit rows output from said barrel shifter match the input entry, and for outputting the matched start code;

a state machine for storing the start code of each layer and a state code corresponding to the start code as an input entry, and for outputting the state code corresponding to the start code output from said code detector;

a code length generator for storing the state code of each layer and a bit number corresponding to each state code as an input entry, and for outputting the bit number corresponding to the state code output from said state machine; and an accumulator for accumulating the outputs of said code length generator and for applying the accumulated value to said barrel shifter as the shift signal and a carry to said registers as a carry signal of said registers.

* * * * *